United States Patent
Yonemura et al.

(10) Patent No.: US 11,171,280 B2
(45) Date of Patent: Nov. 9, 2021

(54) PIEZOELECTRIC DEVICE, LIQUID EJECTION HEAD, AND PRINTER

(71) Applicant: Seiko Epson Corporation, Tokyo (JP)

(72) Inventors: Takayuki Yonemura, Suwa (JP); Yasuto Kakemura, Kai (JP)

(73) Assignee: Seiko Epson Corporation

(*) Notice: Subject to any disclaimer, the term of this patent is extended or adjusted under 35 U.S.C. 154(b) by 84 days.

(21) Appl. No.: 16/553,876

(22) Filed: Aug. 28, 2019

(65) Prior Publication Data
US 2020/0075837 A1 Mar. 5, 2020

(30) Foreign Application Priority Data

Aug. 29, 2018 (JP) .............................. JP2018-160265

(51) Int. Cl.
| | |
|---|---|
| *H01L 41/083* | (2006.01) |
| *H01L 41/09* | (2006.01) |
| *H01L 41/187* | (2006.01) |
| *B41J 2/14* | (2006.01) |

(52) U.S. Cl.
CPC ...... *H01L 41/0831* (2013.01); *B41J 2/14209* (2013.01); *H01L 41/0973* (2013.01); *H01L 41/1873* (2013.01)

(58) Field of Classification Search
CPC ............. H01L 41/0831; H01L 41/0973; H01L 41/1873; B41J 2/14209
See application file for complete search history.

(56) References Cited

U.S. PATENT DOCUMENTS

2011/0221829 A1* 9/2011 Wang .................... C04B 35/495
347/68

FOREIGN PATENT DOCUMENTS

| JP | 2001-223404 A | 8/2001 |
|---|---|---|
| JP | 2013-004707 A | 1/2013 |
| JP | 2014-162709 A | 9/2014 |
| JP | 2018-088524 A | 6/2018 |

* cited by examiner

*Primary Examiner* — Shawki S Ismail
*Assistant Examiner* — Monica Mata
(74) *Attorney, Agent, or Firm* — Harness, Dickey & Pierce, P.L.C.

(57) ABSTRACT

A piezoelectric device includes: a first electrode provided above a substrate; a piezoelectric layer provided above the first electrode; and a second electrode provided above the piezoelectric layer. The piezoelectric layer includes a plurality of layers that includes a composite oxide of a Perovskite structure containing potassium, sodium, and niobium. The piezoelectric layer has a first region and a second region in a 3 μm×3 μm region of a plane perpendicular to a thickness direction of the piezoelectric layer. The first region is a region in which the ratio of an atomic concentration (atm %) of potassium with respect to the sum of the atomic concentration (atm %) of potassium and an atomic concentration (atm %) of sodium is 0.30 to 0.45, and the second region is a region in which the ratio is 0.55 to 0.75.

5 Claims, 10 Drawing Sheets

FIG. 13

| NUMBER OF KNNM LAYERS | R1 | R2 |
|---|---|---|
| FIRST LAYER | 0.30 | 1.12 |
| FIRST LAYER | 0.35 | 1.02 |
| SECOND LAYER | 0.37 | 1.08 |
| FIFTH LAYER | 0.37 | 1.01 |
| FIFTH LAYER | 0.37 | 1.05 |
| FIFTH LAYER | 0.35 | 1.02 |
| SIXTH LAYER | 0.39 | 0.97 |
| SIXTH LAYER | 0.42 | 0.98 |
| SIXTH LAYER | 0.44 | 1.02 |

FIG. 14

| NUMBER OF KNNM LAYERS | R1 | R2 |
|---|---|---|
| FIRST LAYER | 0.61 | 1.01 |
| FIRST LAYER | 0.61 | 1.06 |
| SECOND LAYER | 0.58 | 1.10 |
| FIFTH LAYER | 0.60 | 1.04 |
| FIFTH LAYER | 0.72 | 1.03 |
| FIFTH LAYER | 0.69 | 1.03 |
| SIXTH LAYER | 0.71 | 0.98 |
| SIXTH LAYER | 0.69 | 1.08 |
| SIXTH LAYER | 0.64 | 1.02 |

PIEZOELECTRIC DEVICE, LIQUID EJECTION HEAD, AND PRINTER

The present application is based on, and claims priority from JP Application Ser. No. 2018-160265, filed Aug. 29, 2018, the disclosure of which is hereby incorporated by reference herein in its entirety.

BACKGROUND

1. Technical Field

The present disclosure relates to a piezoelectric device, a liquid ejection head, and a printer.

2. Related Art

A typical example of a liquid ejection head is an inkjet printing head that uses a vibration plate forming a part of a pressure generating chamber that is in communication with nozzle holes that eject liquid droplets, and the liquid inside the pressure generating chamber is forced out through the nozzle holes under the applied pressure created by the deformation of the vibration plate due to a piezoelectric device.

An exemplary configuration of the piezoelectric device used for such an inkjet printing head is one in which a piezoelectric material having an electromechanical transduction function, for example, a piezoelectric layer formed of a crystallized dielectric material, is interposed between a pair of electrodes. Such a piezoelectric layer requires high piezoelectric characteristics.

For example, JP-A-2014-162709 mentions of a structure-gradient region (hereinafter, also referred to as "SGR")—a region with a distorted spontaneous polarization direction at the boundary of different crystalline phases. In this related art, SGR is described as exerting high characteristics because of the spontaneous polarization direction that can freely align itself along the external field within a certain range under an externally applied field.

The foregoing related art describes an example using barium titanate and potassium niobate. A piezoelectric device based on potassium sodium niobate (($K_{1-x}$, $Na_x$)$NbO_3$:KNN) is also required to have high piezoelectric characteristics. For example, an SGR can be formed in the laminate direction of piezoelectric layers by varying the components of the precursor solution layer to layer in laminating the piezoelectric layers. It is, however, difficult to form an SGR along the surface direction of the piezoelectric layer because of difficulties in precisely varying the components of the precursor solution along the surface direction.

SUMMARY

An aspect of the present disclosure is directed to a piezoelectric device that includes:
a first electrode provided above a substrate;
a piezoelectric layer provided above the first electrode; and
a second electrode provided above the piezoelectric layer,
the piezoelectric layer including a plurality of layers that includes a composite oxide of a Perovskite structure containing potassium, sodium, and niobium,
the piezoelectric layer having a first region and a second region in a 3 μm×3 μm region of a plane perpendicular to a thickness direction of the piezoelectric layer, wherein the first region is a region in which a ratio of an atomic concentration (atm %) of potassium with respect to a sum of the atomic concentration (atm %) of potassium and an atomic concentration (atm %) of sodium is 0.30 to 0.45, and the second region is a region in which the ratio is 0.55 to 0.75.

In the piezoelectric device of the aspect of the present disclosure, the second region may have an area ratio of 0.50 to 0.60 with respect to an area of the 3 μm×3 μm region.

In the piezoelectric device of the aspect of the present disclosure, the piezoelectric layer may have a plurality of crystal grains, and the plurality of crystal grains may have an average particle size of 1 μm or less as viewed in the thickness direction.

In the piezoelectric device of the aspect of the present disclosure, the piezoelectric layer may contain manganese.

Another aspect of the present disclosure is directed to a liquid ejection head that includes:
the piezoelectric device of the aspect of the present disclosure; and
a nozzle plate having a nozzle hole for ejecting a liquid,
the substrate having a channel-forming substrate that includes: a pressure generating chamber that undergoes a volumetric change effected by the piezoelectric device; and a supply channel that is in communication with the pressure generating chamber, and through which the liquid is supplied to the pressure generating chamber, and
the nozzle hole being in communication with the pressure generating chamber.

Still another aspect of the present disclosure is directed to a printer that includes:
the liquid ejection head of the aspect of the present disclosure;
a transport mechanism by which a recording medium is moved relative to the liquid ejection head; and
a controller that controls the liquid ejection head and the transport mechanism.

BRIEF DESCRIPTION OF THE DRAWINGS

FIG. 13 is a table representing the ratios R1 and R2 in a first region of a smaller potassium content.

FIG. 14 is a table representing the ratios R1 and R2 in a second region of a greater potassium content.

DESCRIPTION OF EXEMPLARY EMBODIMENTS

A preferred embodiment of the present disclosure is described below in detail, with reference to the accompanying drawings. It is to be noted that the embodiment described below does not unduly limit the substance of the present disclosure recited in the appended claims. The configurations described below also do not necessarily represent all the essential constituents of the present disclosure.

1. Piezoelectric Device

Figure 1:
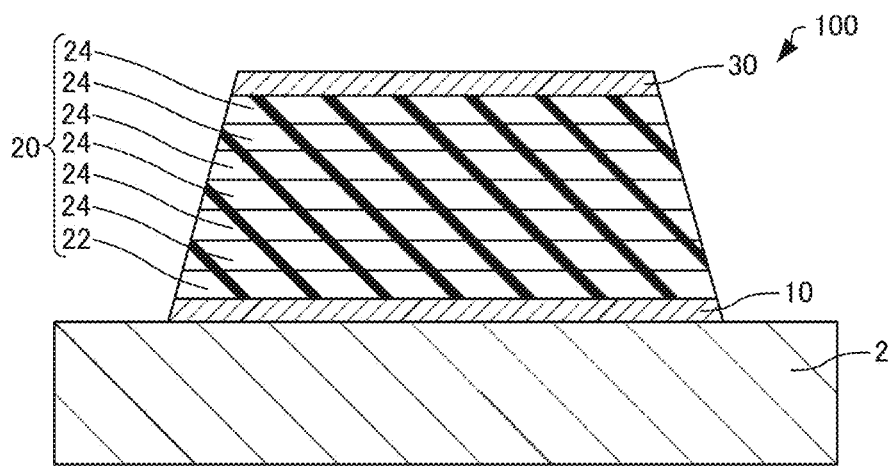
FIG. 1 is a cross sectional view schematically illustrating a piezoelectric device according to an embodiment of the present disclosure.

A piezoelectric device according to the present embodiment is described first, with reference to the accompanying drawings. FIG. 1 is a cross sectional view schematically illustrating a piezoelectric device 100 according to the present embodiment.

As illustrated in FIG. 1, the piezoelectric device 100 includes a first electrode 10, a piezoelectric layer 20, and a second electrode 30. The piezoelectric device 100 is provided above a substrate 2. In the example illustrated in the figure, the piezoelectric device 100 is provided on the substrate 2.

Here, the term "above" as used, for example, in the context where a certain object (hereinafter, referred to as "B") is formed above another certain object (hereinafter, referred to as "A") is intended to mean both directly forming B on A, and indirectly forming B on A via some other object.

The substrate 2 is, for example, a semiconductor or an insulator board. The substrate 2 may be a single layer or a laminate of more than one layer. The internal structure of the substrate 2 is not particularly limited, and the substrate 2 may have a structure with an internal space, provided that the top surface is flat.

The substrate 2 may include a vibration plate that is configured to deform with the movement of the piezoelectric layer 20. The vibration plate is, for example, a silicon oxide layer, a zirconium oxide layer, a silicon nitride layer, an aluminum oxide layer, a tantalum oxide layer, or a laminate of these layers.

The first electrode 10 is provided above the substrate 2. In the example illustrated in the figure, the first electrode 10 is provided on the substrate 2. The first electrode 10 has, for example, a laminar form. The first electrode 10 has a thickness of, for example, 3 nm to 200 nm. The first electrode 10 is, for example, a metal layer such as a platinum layer or an iridium layer, a conductive oxide layer of these metals, or a strontium ruthenate (SrRuO3:SRO) layer. The first electrode 10 may be structured as a laminate of more than one of these layers.

The first electrode 10 is an electrode for applying a voltage to the piezoelectric layer 20. The first electrode 10 represents a lower electrode provided underneath the piezoelectric layer 20.

Between the first electrode 10 and the substrate may be provided an adhesive layer for improving the adhesion between the first electrode 10 and the substrate 2, though not illustrated in the drawing. The adhesive layer is, for example, a titanium layer or a titanium oxide layer.

The piezoelectric layer 20 is provided above the first electrode 10. In the example illustrated in the figure, the piezoelectric layer 20 is provided on the first electrode 10. The piezoelectric layer 20 is interposed between, for example, the first electrode 10 and the second electrode 30. The piezoelectric layer 20 has a thickness of, for example, 100 nm to 3 μm. The piezoelectric layer 20 is configured to deform under an applied voltage across the first electrode 10 and the second electrode 30.

The piezoelectric layer 20 has, for example, a first layer 22 and a second layer 24. The first layer 22 is provided on the first electrode 10. The first layer 22 is, for example, a layer that includes a composite oxide of a Perovskite structure containing potassium (K), sodium (Na), niobium (Nb), manganese (Mn), and calcium (Ca). The first layer 22 is, for example, a KNN layer with added manganese and calcium. With the calcium contained in the first layer 22, the first layer 22 can easily generate a KNN crystal nucleus. The first layer 22 has a thickness of, for example, 50 nm to 100 nm.

The second layer 24 is provided on the first layer 22. The piezoelectric layer 20 includes a plurality of second layers 24. The second layers 24 are laminated. The number of second layers 24 is not particularly limited. In the example illustrated in the figure, a total of six second layers 24 are provided. The second layer 24 is, for example, a layer of a Perovskite structure containing potassium, sodium, niobium, and manganese. The second layer 24 is, for example, a KNN layer with added manganese.

The thickness of each second layer 24 is, for example, 50 nm to 100 nm. The second layer 24 has, for example, a (100) orientation. The second layer 24 has a plurality of crystal grains. The crystal grains of the second layer 24 have a Perovskite crystalline structure. The crystal grains of the second layer 24 have an average particle size of 1 μm or less as viewed along the thickness direction of the piezoelectric layer 20. The average particle size of the crystal grains can be determined with, for example, a scanning electron microscope (SEM).

Figure 2:
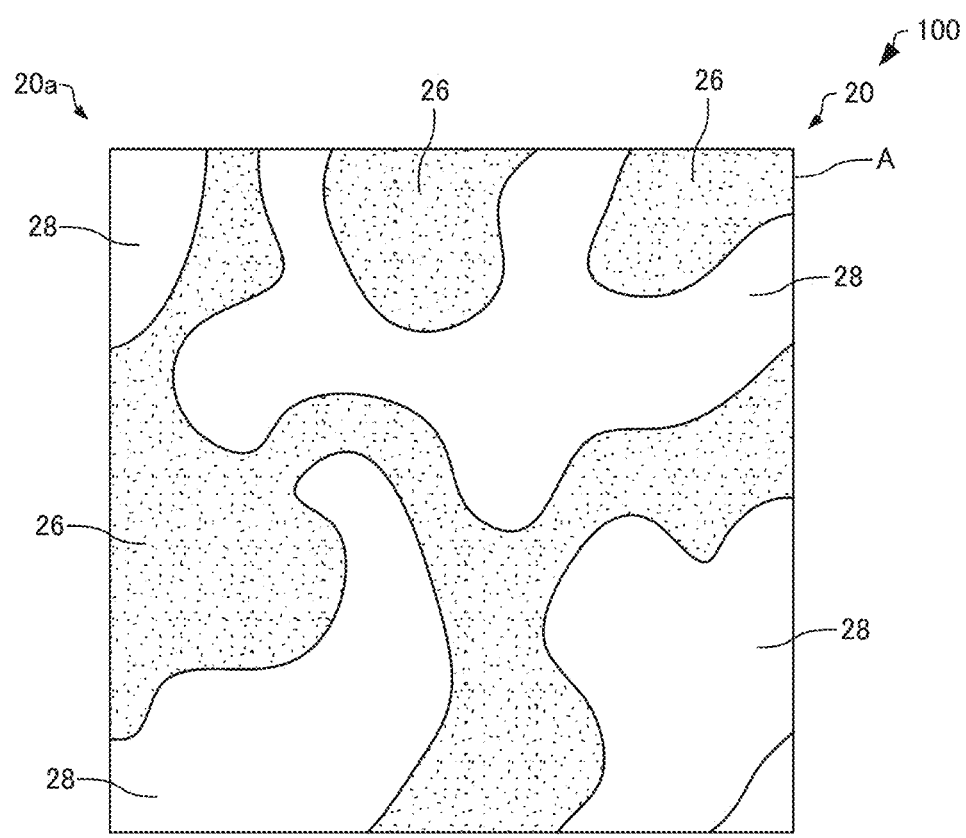
FIG. 2 is a plan view schematically representing a 3 μm×3 μm region of a plane perpendicular to the thickness direction of a piezoelectric layer of the piezoelectric device according to the embodiment of the present disclosure.

FIG. 2 is a plan view schematically representing a 3 μm×3 μm region A of a plane 20a perpendicular to the thickness direction of the piezoelectric layer 20. The thickness direction of the piezoelectric layer 20 is a direction in which the second layers 24 are laminated. The plane 20a represents a surface of the piezoelectric layer 20, and may be a top surface of the second layer 24, or may be a cut surface perpendicular to the thickness direction of the piezoelectric layer 20. The region A is a 3 μm×3 μm square region.

As illustrated in FIG. 2, the piezoelectric layer 20 has a first region 26 and a second region 28 in the region A. The first region 26 is a region where the ratio R1 (NK/(NK+NNa)) of potassium atomic concentration NK (atm %) with respect to the sum of potassium atomic concentration NK (atm %) and sodium atomic concentration NNa (atm %) is 0.30 to 0.45. Preferably, the first region 26 is a region where the ratio R1 is 0.30 to 0.44. The second region 28 is a region where the ratio R1 is 0.55 to 0.75. Preferably, the second region 28 is a region where the ratio R1 is 0.58 to 0.72. The potassium atomic concentration and the sodium atomic concentration can be measured by energy dispersive X-ray spectroscopy (EDS). In the example illustrated in the figure, the region A has a plurality of first regions 26, and a plurality of second regions 28.

The area ratio of first region 26 with respect to the region A of the piezoelectric layer 20 is, for example, 0.40 to 0.50.

The area ratio of second region 28 with respect to the region A is, for example, 0.50 to 0.60. The areas of the first region 26 and the second region 28 can be determined from the atomic concentration-dependent contrast in an EDS mapping image. For example, the areas can be determined with ease by binarizing the contrast.

The boundary between the first region 26 and the second region 28 is a crystal grain boundary. It should be noted, however, that the first region 26 has a plurality of crystal grains, instead of representing a single crystal grain. The second region 28 also has a plurality of crystal grains.

In the second layer 24, the ratio R2 ((NK+NNa)/NNb), which is a ratio of the sum of potassium atomic concentration NK (atm %) and sodium atomic concentration NNa (atm %) with respect to niobium atomic concentration NNb (atm %), is, for example, 0.90 to 1.2, preferably 0.97 to 1.12.

The second electrode 30 is provided above the piezoelectric layer 20. In the example illustrated in the figure, the second electrode 30 is provided on the piezoelectric layer 20. The second electrode 30 may be provided also at the side surfaces of the piezoelectric layer 20 and on the substrate 2, though not illustrated in the drawing.

The second electrode 30 has, for example, a laminar form. The second electrode 30 has a thickness of, for example, 15 nm to 300 nm. The second electrode 30 is, for example, a metal layer such as an iridium layer or a platinum layer, a conductive oxide layer of these metals, or a strontium ruthenate layer. The second electrode 30 may be structured as a laminate of more than one of these layers.

The second electrode 30 is an electrode for applying a voltage to the piezoelectric layer 20. The second electrode 30 represents an upper electrode provided above the piezoelectric layer 20.

The piezoelectric device 100 has the following characteristics, for example.

In the piezoelectric device 100, the piezoelectric layer 20 has a plurality of second layers 24 that includes a composite oxide of a Perovskite structure containing potassium, sodium, and niobium. The piezoelectric layer 20 has the first region 26 and the second region 28 in the region A, which is a square region measuring 3 μm each side. The first region 26 is a region where the ratio R1 is 0.30 to 0.45. The second region 28 is a region where the ratio R1 is 0.55 to 0.75. Because of these characteristics, in the piezoelectric device 100, the lattice constant of the Perovskite structure is larger in the first region 26 of a greater sodium content than in the second region 28 of a greater potassium content. This is because sodium has a larger atomic radius than potassium. Such a lattice constant difference creates an SGR between the first region 26 and the second region 28. The piezoelectric device 100 therefore has an SGR also in the second layers 24, in a direction along the surface of the piezoelectric layer 20, that is, a direction perpendicular to the thickness direction of the piezoelectric layer 20. With the SGR formed in the second layers 24, the piezoelectric device 100 can have high piezoelectric characteristics.

In the piezoelectric device 100, the crystal grains in the second layer 24 have an average particle size of 1 μm or less as viewed in the thickness direction of the piezoelectric layer 20. Because the boundary between the first region 26 and the second region 28 is a crystal grain boundary, the piezoelectric device 100 can have a large area ratio of SGR at the surface of the piezoelectric layer 20, as compared to when, for example, the crystal grains have an average particle size of more than 1 μm.

In the piezoelectric device 100, the second layers 24 contain manganese. This makes it possible to reduce the leak current in the piezoelectric device 100, as compared to when the second layers 24 do not contain manganese.

2. Method of Production of Piezoelectric Device

A method for producing the piezoelectric device 100 according to the present embodiment is described below, with reference to the accompanying drawings.

The substrate 2 is prepared, as shown in FIG. 1. Specifically, a silicon substrate is thermally oxidized to form a silicon oxide layer. This is followed by formation of a zirconium layer on the silicon oxide layer, using a method such as sputtering. The zirconium layer is then thermally oxidized to form a zirconium oxide layer. The substrate 2 can be prepared with these steps.

Thereafter, the first electrode 10 is formed on the substrate 2. The first electrode 10 is formed by using a method, for example, such as sputtering or vacuum vapor deposition. The first electrode 10 is then patterned by, for example, photolithography and etching.

This is followed by formation of the piezoelectric layer 20 on the first electrode 10. The piezoelectric layer 20 is formed by using a chemical solution deposition (CSD) method, for example, such as a sol-gel method or MOD (Metal Organic Deposition). The following describes how the piezoelectric layer 20 is formed.

First, a first precursor solution is prepared by dissolving or dispersing, for example, a potassium-containing metal complex, a sodium-containing metal complex, a niobium-containing metal complex, a manganese-containing metal complex, and a calcium-containing metal complex in an organic solvent. Separately, a second precursor solution is prepared by dissolving or dispersing a potassium-containing metal complex, a sodium-containing metal complex, a niobium-containing metal complex, and a manganese-containing metal complex in an organic solvent.

Examples of the potassium-containing metal complex include potassium 2-ethylhexanoate, and potassium acetate. Examples of the sodium-containing metal complex include sodium 2-ethylhexanoate, and sodium acetate. Examples of the niobium-containing metal complex include niobium 2-ethylhexanoate, pentaethoxy niobium, and pentabutoxy niobium. Examples of the manganese-containing metal complex include manganese 2-ethylhexanoate. Examples of the calcium-containing metal complex include calcium 2-ethylhexanoate, and calcium acetate. Two or more metal complexes may be used in combination. For example, the potassium-containing metal complex may be a combination of potassium 2-ethylhexanoate and potassium acetate.

Examples of the solvent include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, and mixed solvents thereof.

The first precursor solution prepared is applied onto the first electrode 10 to form a precursor layer, using a method such as spin coating (coating step). The precursor layer is then heated at, for example, 130° C. to 250° C. to dry for a certain length of time (drying step). The dried precursor layer is then heated at, for example, 300° C. to 450° C., and held for a certain length of time to remove grease (degreasing step). After removing grease, the precursor layer is heated at, for example, 550° C. to 800° C., and held at this temperature for a certain length of time to crystallize (firing step). The first layer 22 can be formed after these steps.

The surface of the first layer 22 is washed with water. This removes foreign materials. The foreign materials include, for example, potassium hydroxide produced after the potassium that did not react and did not form the Perovskite structure reacts with moisture in the atmosphere, and calcium carbonate produced by the reaction of calcium with carbon dioxide. A foreign material tends to occur on the surface of the first layer 22 particularly when the first layer 22 contains calcium.

The second precursor solution is also subjected to the series of steps from coating to firing, in the same manner as in the formation of the first layer 22. This forms the second layer 24 on the first layer 22. The temperature of the firing step forming the second layer 24 may be higher than the temperature of the firing step forming the first layer 22.

The second precursor solution is subjected to the coating to firing steps multiple times in a repeated fashion. In this way, the piezoelectric layer 20 can be formed that includes the first layer 22 and a plurality of second layers 24. Desirably, the second layers 24 are washed with water after each formation. In this way, foreign materials that generate on the surface of the second layer 24 can be removed.

The formation of the piezoelectric layer 20 by chemical solution deposition described above proceeds with formation of NaNbO3 first, followed by formation of KNbO3 around the NaNbO3. The piezoelectric layer 20 can thus have the first region 26 and the second region 28 with uneven proportions of potassium and sodium in the plane 20a perpendicular to the thickness direction of the piezoelectric layer 20.

The piezoelectric layer 20 is patterned by, for example, photolithography and etching. The first electrode 10 and the piezoelectric layer 20 may be patterned in the same step. Alternatively, the first electrode 10 and the first layer 22 may be patterned in the same step before forming the second layer 24.

Thereafter, the second electrode 30 is formed on the piezoelectric layer 20. The second electrode 30 is formed by using a method, for example, such as sputtering or vacuum vapor deposition. The second electrode 30 is then patterned by, for example, photolithography and etching.

The piezoelectric device 100 can be produced after these steps.

As described above, in the method of production of the piezoelectric device 100, the piezoelectric layer 20 is formed by chemical solution deposition, and is washed with water after forming the first layer 22, preferably after the formation of the first layer 22 and after each formation of the second layers 24. In this way, the piezoelectric layer 20 can be formed that has the first region 26 and the second region 28, and that is free of foreign materials between the first layer 22 and the second layer 24, and between the adjacent second layers 24. Foreign materials impair the piezoelectric characteristics.

3. Liquid Ejection Head

Figure 3:
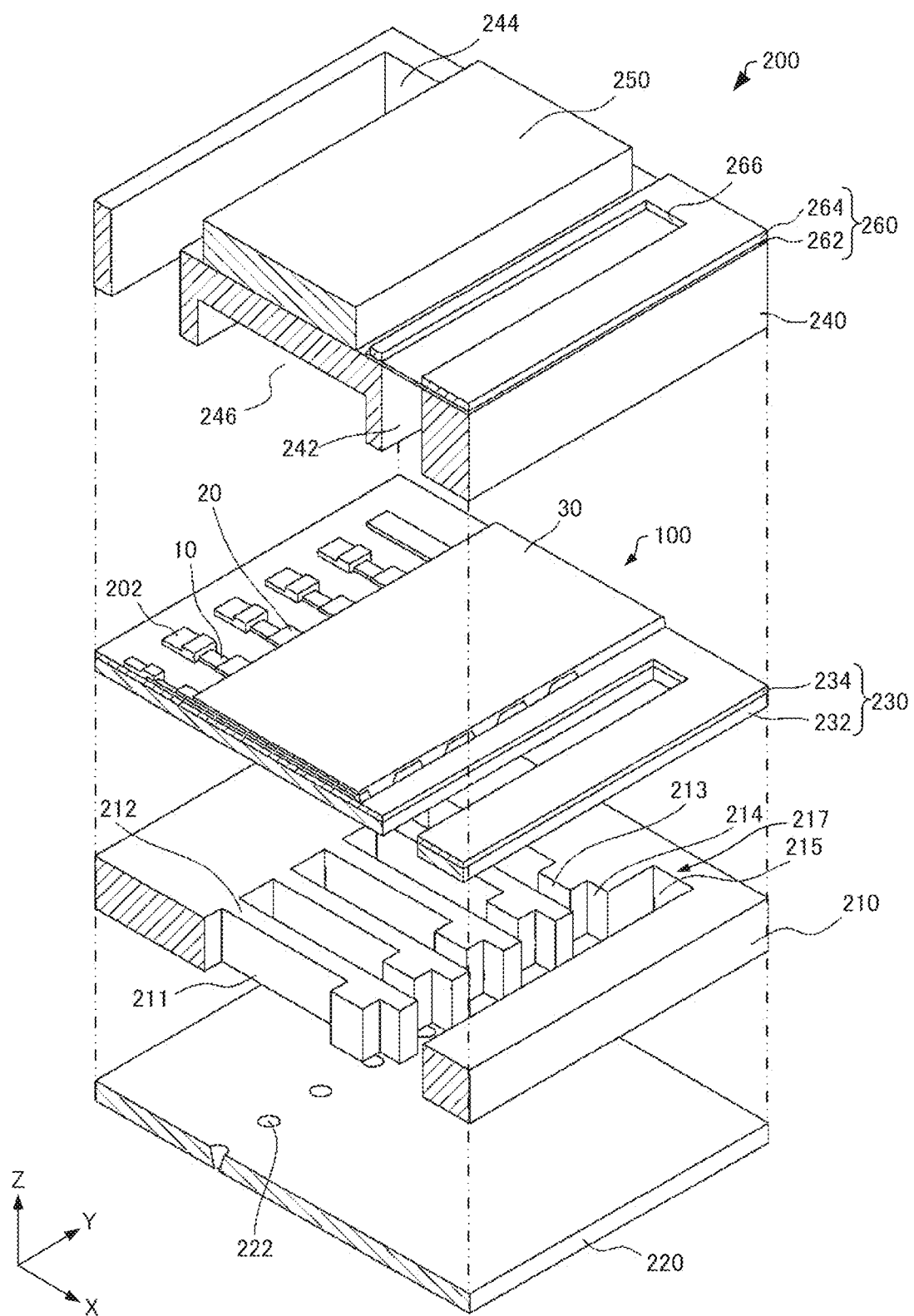
FIG. 3 is an exploded perspective view schematically representing a liquid ejection head according to the embodiment of the present disclosure.
Figure 4:
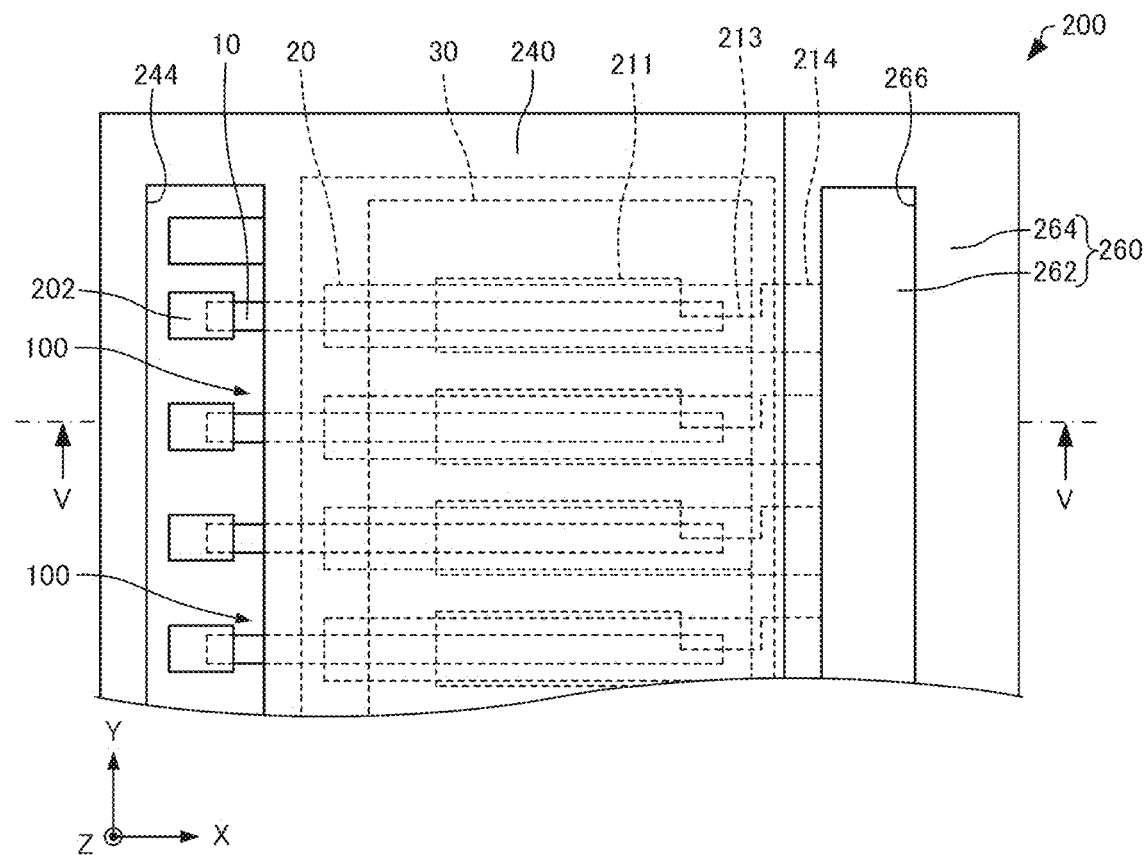
FIG. 4 is a plan view schematically representing the liquid ejection head according to the embodiment of the present disclosure.
Figure 5:
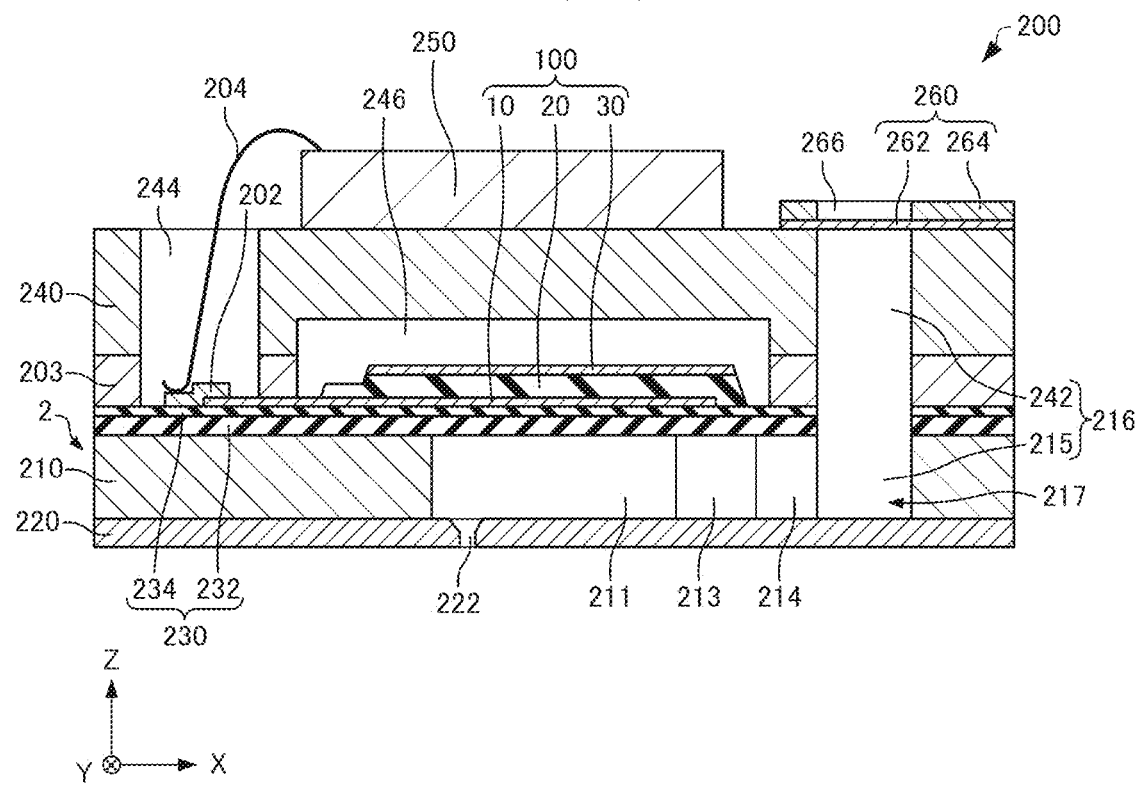
FIG. 5 is a cross sectional view schematically representing the liquid ejection head according to the embodiment of the present disclosure.

A liquid ejection head according to the present embodiment is described below, with reference to the accompanying drawings. FIG. 3 is an exploded perspective view schematically representing a liquid ejection head 200 according to the present embodiment. FIG. 4 is a plan view schematically representing the liquid ejection head 200 according to the present embodiment. FIG. 5 is a cross sectional view schematically representing the liquid ejection head 200 according to the present embodiment at line V-V of FIG. 4. FIGS. 3 to 5 are presented with X, Y, and Z axes that are orthogonal to one another.

As illustrated in FIGS. 3 to 5, the liquid ejection head 200 includes, for example, the substrate 2, the piezoelectric device 100, a nozzle plate 220, a protecting board 240, a circuit board 250, and a compliance substrate 260. The substrate 2 includes a channel-forming substrate 210, and a vibration plate 230. As a mater of convenience, the circuit board 250 is omitted in FIG. 4.

The channel-forming substrate 210 is, for example, a silicon substrate. The channel-forming substrate 210 has pressure generating chambers 211. The pressure generating chambers 211 are parted by a plurality of barrier ribs 212. The pressure generating chambers 211 undergo volumetric changes effected by the piezoelectric device 100.

The channel-forming substrate 210 has a supply pathway 213 and a communication pathway 214 at an end portion of each pressure generating chamber 211 at the positive side of the X axis. The supply pathway 213 is configured to reduce the aperture area by narrowing the end portion of the pressure generating chamber 211 along the Y axis at the positive side of the X axis. As an example, the communication channel 214 is equal in size to the pressure generating chamber 211 along the Y axis. A communication section 215 is provided at the positive side of the communication channels 214 along the X axis. The communication section 215 constitutes a part of a manifold 216. The manifold 216 represents a common liquid chamber of the pressure generating chambers 211. As described above, the supply channel 217 comprised of the supply pathways 213, the communication pathways 214, and the communication section 215 is formed in the channel-forming substrate 210 that includes the pressure generating chambers 211. The supply channel 217 is in communication with the pressure generating chambers 211, and supplies a liquid to the pressure generating chambers 211.

The nozzle plate 220 is provided at one surface side of the channel-forming substrate 210. The nozzle plate 220 is formed of, for example, SUS (Steel Use Stainless). The nozzle plate 220 is attached to the channel-forming substrate 210 with, for example, an adhesive or a heat fusion film. The nozzle plate 220 has nozzle holes 222 disposed side by side along the Y axis. The nozzle holes 222 are in communication with the pressure generating chambers 211.

The vibration plate 230 is provided at the other surface side of the channel-forming substrate 210. For example, the vibration plate 230 is configured from a first insulating layer 232 provided on the channel-forming substrate 210, and a second insulating layer 234 provided on the first insulating layer 232. The first insulating layer 232 is, for example, a silicon oxide layer. The second insulating layer 234 is, for example, a zirconium oxide layer.

The piezoelectric device 100 is provided on, for example, the vibration plate 230. The liquid ejection head 200 includes a plurality of piezoelectric devices 100. The number of piezoelectric devices 100 is not particularly limited.

In the liquid ejection head 200, the vibration plate 230 and the first electrode 10 makes a displacement as a result of deformation of the piezoelectric layer 20 having an electromechanical transduction characteristic. That is, in the liquid ejection head 200, the function as a vibrating plate is served essentially by the vibration plate 230 and the first electrode 10. The vibration plate 230 may be omitted, and the first electrode 10 may solely function as a vibration plate. When the first electrode 10 is directly provided on the channel-forming substrate 210, it is desirable to protect the first electrode 10 with, for example, an insulating protective film to avoid a liquid from contacting the first electrode 10.

The first electrode 10 is configured as a separate electrode, independently provided for each pressure generating chamber 211. The first electrode 10 is smaller in size than the pressure generating chamber 211 along the Y axis. The first electrode 10 is larger in size than the pressure generating chamber 211 along the X axis. The both end portions of the first electrode 10 are beyond the end portions of the pressure generating chamber 211 along the X axis. The first electrode 10 is coupled to a lead electrode 202 at the end portion on the negative side of the X axis.

The piezoelectric layer 20 is larger in size than, for example, the first electrode 10 along the Y axis. The piezoelectric layer 20 is larger in size than, for example, the pressure generating chamber 211 along the X axis. The end portion of the piezoelectric layer 20 at the positive side of the X axis is, for example, beyond the end portion of the first electrode 10 at the positive side of the X axis. The end portion of the first electrode 10 at the positive side of the X axis is covered with the piezoelectric layer 20. On the other hand, the end portion of the piezoelectric layer 20 at the negative side of the X axis is, for example, within the end portion of the first electrode 10 at the negative side of the X axis. The end portion of the first electrode 10 at the negative side of the X axis is not covered with the piezoelectric layer 20.

The second electrode 30 is continuously provided on the piezoelectric layer 20 and the vibration plate 230, for example. The second electrode 30 is configured as a common electrode of the plurality of piezoelectric devices 100. The common electrode may be the first electrode 10, instead of the second electrode 30, though not shown in the drawings.

The protecting board 240 is attached to the channel-forming substrate 210 with an adhesive 203. The protecting board 240 has a through hole 242. In the example illustrated in the figure, the through hole 242 penetrates through the protecting board 240 along the Z axis, and is in communication with the communication section 215. The through hole 242 and the communication section 215 constitute the manifold 216, which is a common liquid chamber of the pressure generating chambers 211. The protecting board 240 also has a through hole 244 that penetrates through the protecting board 240 along the Z axis. The through hole 244 is where the end portion of the lead electrodes 202 is situated.

The protecting board 240 has an opening 246. The opening 246 is a space that does not interfere with the driving of the piezoelectric device 100. The opening 246 may or may not be sealed.

The circuit board 250 is provided on the protecting board 240. The circuit board 250 includes a semiconductor integrated circuit (semiconductor IC) for driving the piezoelectric devices 100. The circuit board 250 is electrically coupled to the lead electrodes 202 with interconnection wires 204.

The compliance substrate 260 is provided on the protecting board 240. The compliance substrate 260 includes a sealing layer 262 provided on the protecting board 240, and a fixing board 264 provided on the sealing layer 262. The sealing layer 262 is a layer for sealing the manifold 216. The sealing layer 262 is flexible, for example. The fixing board 264 has a through hole 266. The through hole 266 penetrates through the fixing board 264 along the Z axis. The through hole 266 is situated over the manifold 216 as viewed in a Z-axis direction.

4. Printer

Figure 6:
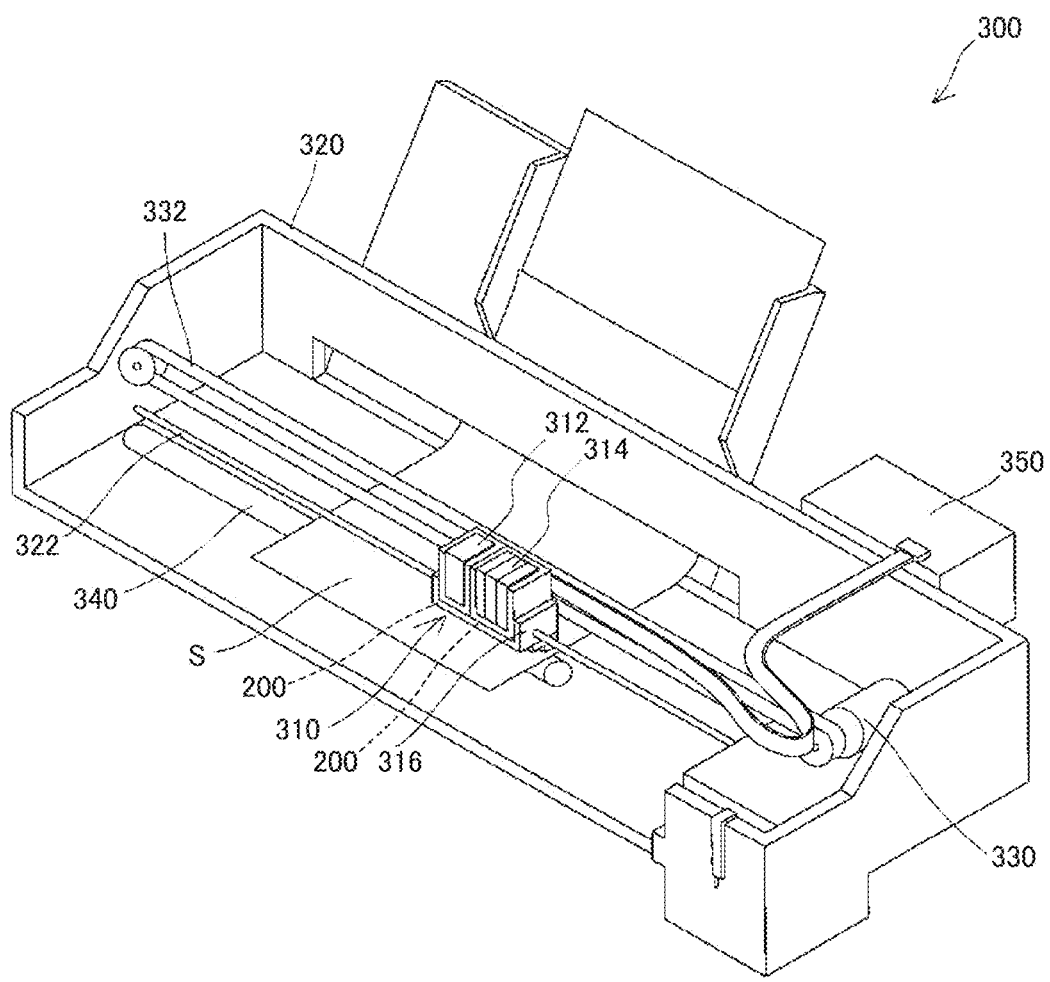
FIG. 6 is a perspective view schematically representing a printer according to the embodiment of the present disclosure.

A printer according to the present embodiment is described below, with reference to the accompanying drawings. FIG. 6 is a perspective view schematically representing a printer 300 according to the present embodiment.

A printer according to the present disclosure includes a liquid ejection head of the present disclosure. As an example, the following describes the printer 300 including the liquid ejection head 200.

The printer 300 is an inkjet printer. As illustrated in FIG. 6, the printer 300 includes a head unit 310. The head unit 310 includes, for example, the liquid ejection head 200. The number of liquid ejection heads 200 is not particularly limited. The head unit 310 includes detachable cartridges 312 and 314, which constitute liquid supplying means. A carriage 316 mounting the head unit 310 is movably provided on a carriage shaft 322 attached to a body 320 so that the carriage 316 can freely move along the shaft axis for ejection of the liquid supplied from the liquid supplying means.

As used herein, "liquid" refers to a material in a liquid phase, and encompasses liquid-like materials such as a sol and a gel. Aside from materials in a liquid form, "liquid" also includes particles of solid functional materials such as pigments and metal particles dissolved, dispersed, or mixed in a solvent. Typical examples of the liquid include inks and liquid crystal emulsifiers. The inks include common aqueous inks and oil inks, and various liquid-like compositions such as gel inks and hot melt inks.

In the printer 300, the carriage 316 mounting the head unit 310 moves along the carriage shaft 322 under the driving force transmitted from a drive motor 330 to the carriage 316 via a plurality of gears and a timing belt 332 (not illustrated). The body 320 has a transport roller 340, which is a transport mechanism by which a sheet S (a recording medium such as paper) is moved relative to the liquid ejection head. The transport mechanism for transporting the sheet S is not limited to a transport roller, and may be, for example, a belt or a drum.

The printer 300 includes a printer controller 350, which is a controller for controlling the liquid ejection head 200 and the transport roller. The printer controller 350 is electrically coupled to the circuit board 250 of the liquid ejection head 200. The printer controllers 350 includes, for example, a RAM (Random Access Memory) as a temporary storage of various data, a ROM (Read Only Memory) storing programs such as control programs, a CPU (Central Processing Unit), and a drive signal generating circuit that generates a drive signal sent to the liquid ejection head 200.

The applicable areas of the piezoelectric device 100 are not limited to liquid ejection heads and printers, and the piezoelectric device 100 is applicable to a wide range of fields. For example, the piezoelectric device 100 can be suitably used in various applications, including, for example, sensors such as gyro sensors and acceleration sensors, timing devices such as tuning fork-type resonators, ultrasonic devices such as ultrasonic motors, p pumps, and flexural vibration-type piezoelectric actuators such as liquid-level sensors.

5. Experiment Example

The present disclosure is described below in greater detail using Experiment Example. It is to be noted that the present disclosure is in no way limited by the following Experiment Example.

5.1. Sample Production 5.1.1. Production of Precursor Solutions

Potassium acetate and 2-ethylhexanoic acid were mixed, and the mixed solution was stirred under heat. After cooling the mixed solution to room temperature, n-octane was added to produce a potassium 2-ethylhexanoate solution. In the same manner, a sodium 2-ethylhexanoate solution, a niobium 2-ethylhexanoate solution, a manganese 2-ethylhexanoate solution, and a calcium 2-ethylhexanoate solution were prepared using sodium acetate, niobium ethoxide, manganese acetate, and calcium acetate.

The concentrations of these solutions were measured by inductively coupled Plasma (ICP) analysis. Thereafter, the potassium 2-ethylhexanoate solution, the sodium 2-ethylhexanoate solution, the niobium 2-ethylhexanoate solution, the manganese 2-ethylhexanoate solution, and the calcium 2-ethylhexanoate solution were mixed to produce a KNCNM precursor solution. Separately, a KNNM precursor solution was prepared by mixing the potassium 2-ethylhexanoate solution, the sodium 2-ethylhexanoate solution, the niobium 2-ethylhexanoate solution, and the manganese 2-ethylhexanoate solution.

The KNCNM and the KNNM precursor solutions were prepared in the following molar concentration ratios.
KNCNM precursor solution
K:Na:Nb:Mn:Ca=86:126:199:1:8
KNNM precursor solution
K:Na:Nb:Mn=103:103:199:1

5.1.2. Production of Piezoelectric Layer

A silicon substrate was thermally oxidized to form a 1,080 nm-thick silicon dioxide layer. A zirconium oxide layer, 400-nm thick, was then formed on the silicon dioxide layer by DC (Direct Current) sputtering. This was followed by formation of a 50 nm-thick platinum layer as the first electrode by DC sputtering.

The KNCNM precursor solution was applied onto the platinum layer by spin coating to form a KNCNM precursor layer. The KNCNM precursor layer was heated to dry on a hot plate at 180° C. After being further heated at 380° C. to remove grease, the KNCNM precursor layer was fired at 575° C. with an infrared annealing device (rapid thermal annealing, or RTA for short) to form a KNCNM layer. The surface of the KNCNM layer was washed with water.

A KNNM layer was formed using the same steps used to form the KNCNM layer, except that the KNCNM precursor solution was replaced with the KNNM precursor solution, and that the fire temperature was changed to 750° C. The surface of the KNNM layer was washed with water.

The formation and water washing of the KNNM layer was performed multiple times by repeating the steps, and a piezoelectric layer was obtained that had a single KNCNM layer and six KNNM layers.

5.2. Surface SEM-EDS Measurement

Figure 7:
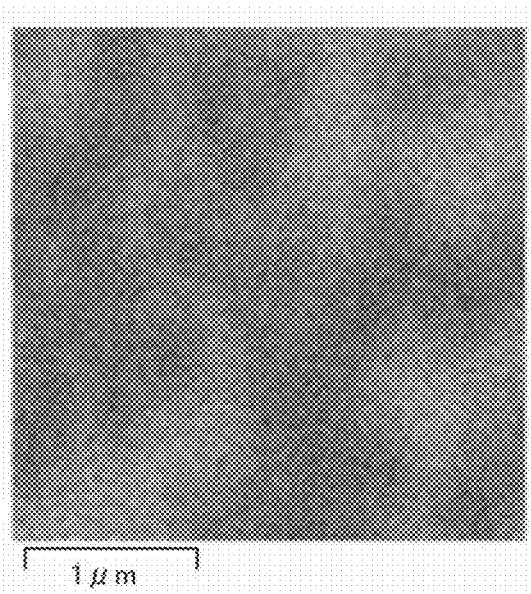
FIG. 7 shows an EDS mapping image of potassium.
Figure 8:
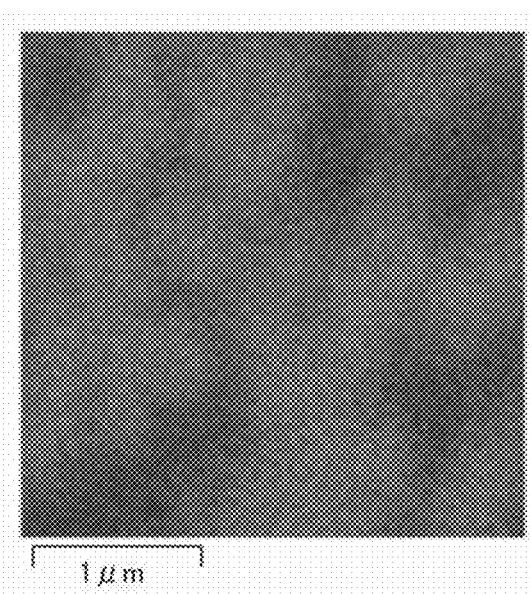
FIG. 8 shows an EDS mapping image of sodium.
Figure 9:
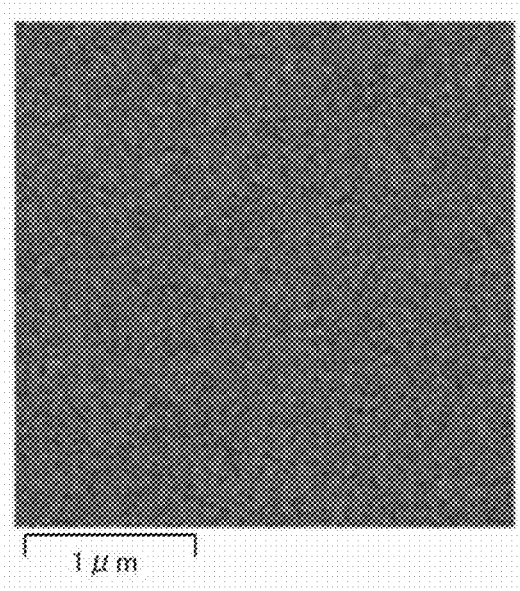
FIG. 9 shows an EDS mapping image of niobium.
Figure 10:
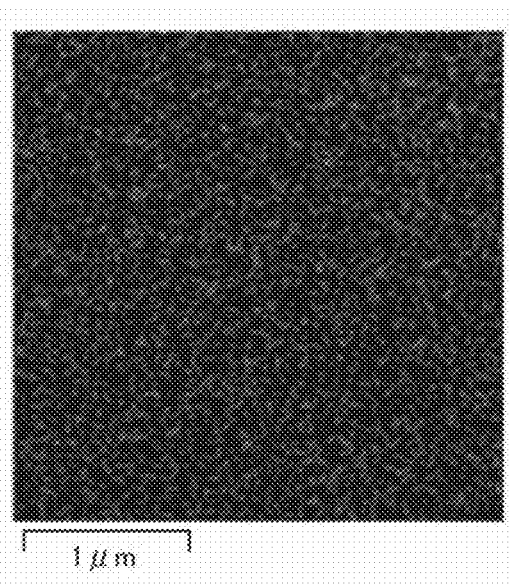
FIG. 10 shows an EDS mapping image of manganese.
Figure 11:
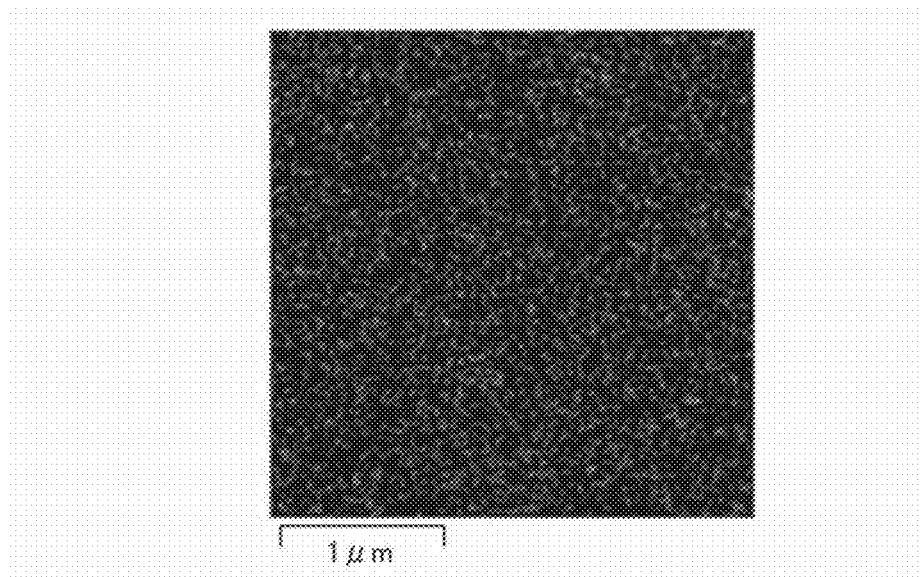
FIG. 11 shows an EDS mapping image of calcium.

The top surface of the piezoelectric layer produced in the manner described above was measured by EDS, using the JEOL product JSM-7800F. FIG. 7 shows an EDS mapping image of potassium. FIG. 8 shows an EDS mapping image of sodium. FIG. 9 shows an EDS mapping image of niobium. FIG. 10 shows an EDS mapping image of manganese. FIG. 11 shows an EDS mapping image of calcium. The fields shown in FIGS. 7 to 11 are 3 μm×3 μm. In FIGS. 7 to 11, the number of elements is greater in lighter portions, and is smaller is darker portions.

As shown in FIGS. 7 and 8, potassium and sodium were shown to have an in-plane distribution, with a greater amount of sodium being present in the first region where the amount of potassium was smaller, and a smaller amount of sodium being present in the second region where the amount of potassium was greater. As shown in FIG. 9, niobium was uniformly distributed in the plane. As shown in FIGS. 10 and 11, manganese and calcium were unmeasurable because of issues related to the detection sensitivity of EDS.

Figure 12:
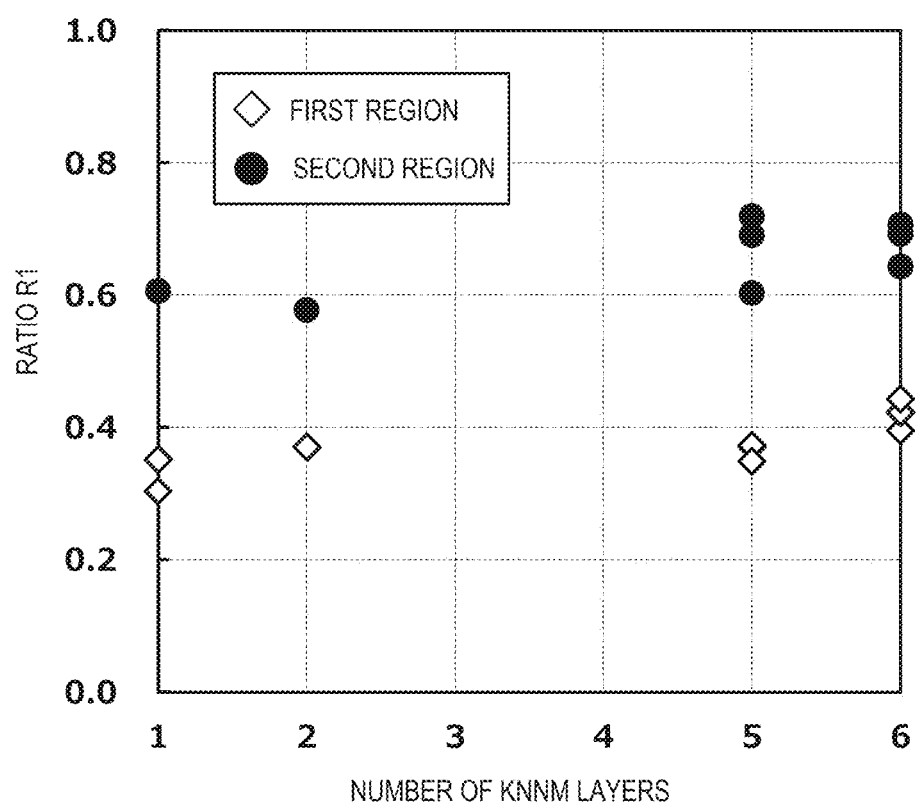
FIG. 12 is a graph representing the ratio R1 determined by EDS measurement.

FIG. 12 is a graph representing the ratio R1 (NK/(NK+NNa)) measured by EDS at the top surface of the KNNM layer. FIG. 12 shows the result of the EDS measurement on the first, second, fifth, and sixth KNNM layers after the formation of these layers. FIG. 13 is a table representing the ratio R1 and the ratio R2 ((NK+NNa)/NNb) in the first region where the amount of potassium was smaller. FIG. 14 is a table representing the ratios R1 and R2 in the second region where the amount of potassium was greater. The graph shown in FIG. 12 is a plot of the values presented in FIGS. 13 and 14.

As shown in FIGS. 12 to 14, the ratio R2 had values that were substantially in line with the charged amounts. However, it was found that the top surface of each KNNM layer had the first region of a smaller potassium content, and the second region of a greater potassium content. Having different ratios R1 means that the Perovskite structure has different lattice constants in the first region and the second region. The experiment therefore demonstrated the formation of an SGR in the KNNM layers.

Figure 15:
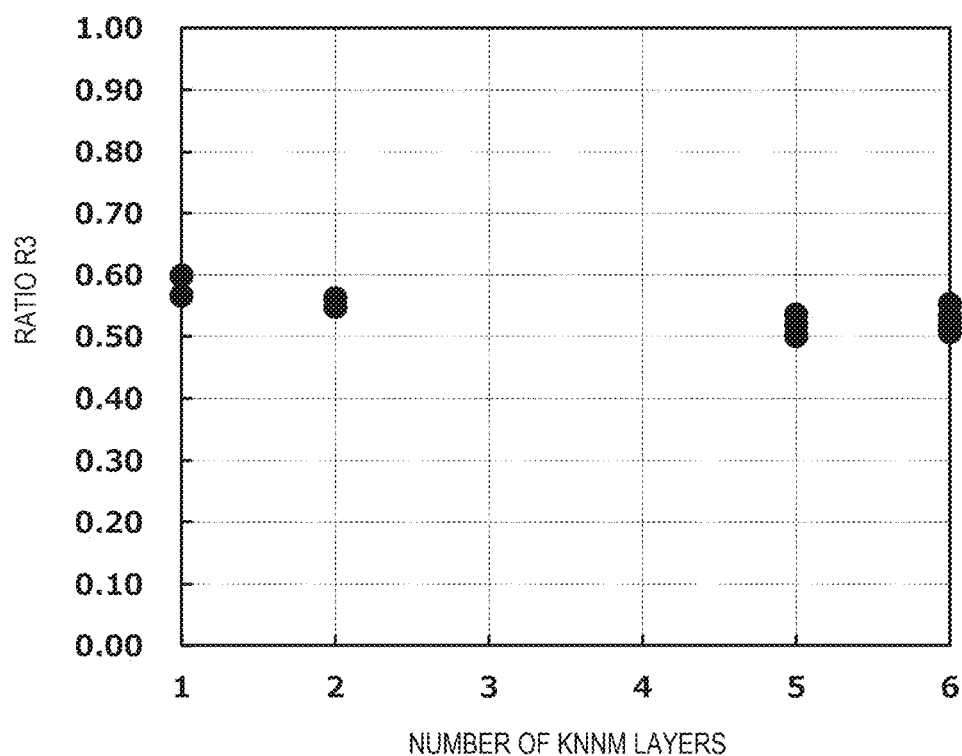
FIG. 15 is a graph representing the area ratio R3 of the second region of a greater potassium content with respect to a 3 μm×3 μm region.

FIG. 15 is a graph representing the area ratio R3 of the second region with respect to the 3 μm×3 μm region representing the field at the top surface of the KNNM layer. The ratio R3 was calculated from the EDS mapping image by binarizing the contrast that depends on the atomic concentration. As shown in FIG. 15, the ratio R3 was 0.50 to 0.60.

5.3. Structure Analysis

The piezoelectric layer produced in the manner described above was analyzed with regard to its crystalline structure and orientation. The analysis was conducted by measuring the two-dimensional mapping image and the diffraction pattern using the Bruker AXS product D8 Discover. The measurements used CuKα as a radiation source, and were conducted using a two-dimensional detector (GADDS). The diffraction peaks observed were all diffraction peaks from the substrate, the electrodes, and the piezoelectric layer, and the phase was not observable. The KNCNM layer and the KNNM layers showed only peaks corresponding to the (100) orientation of when the crystals were regarded as pseudo cubical. The result therefore showed that the KNNM layer preferentially had the (100) orientation.

5.4. SEM Cross Section Observation

The KNCNM layer and the KNNM layers were measured for thickness by observing a fractured cross section with a scanning electron microscope (SEM). The thickness was 75 nm for both the KNCNM layer and the KNNM layer.

5.5. Removal of Foreign Materials by Water Washing

Figure 16:
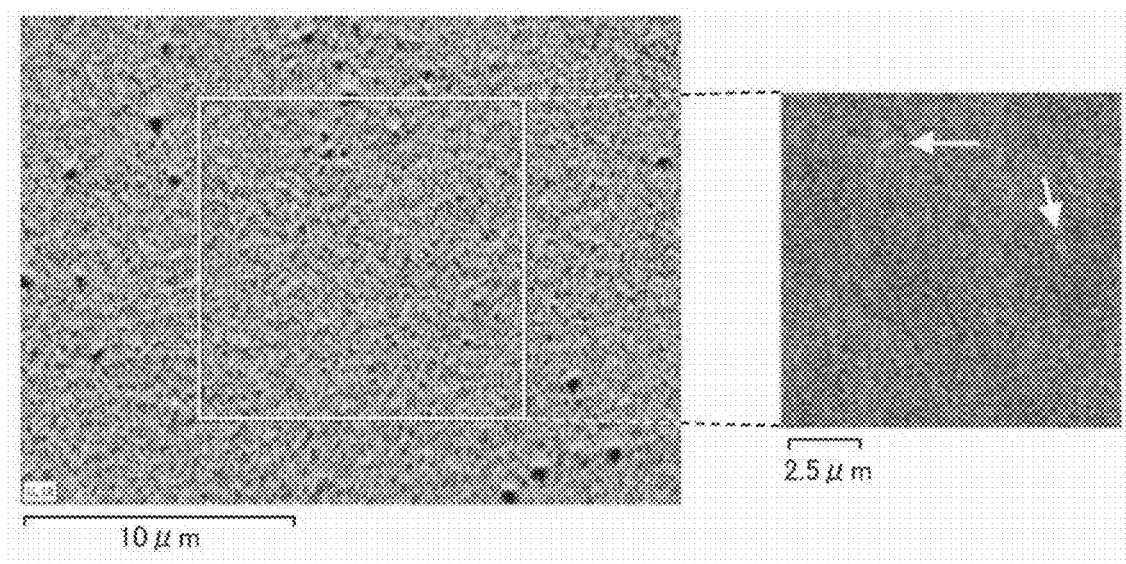
FIG. 16 shows an SEM image and an EDS mapping image of potassium.
Figure 17:
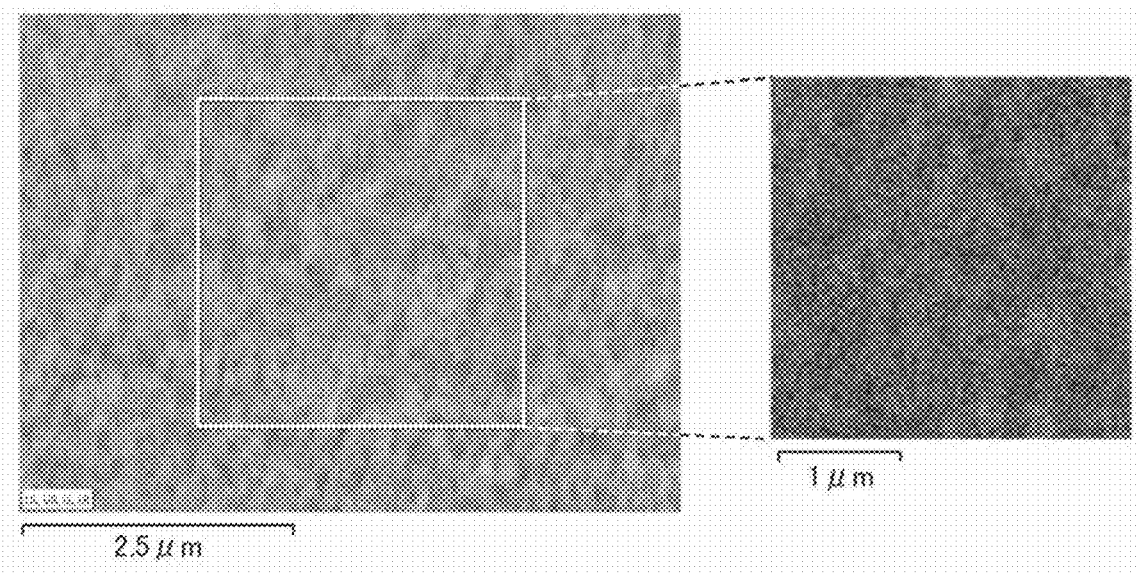
FIG. 17 shows an SEM image and an EDS mapping image of potassium.
Figure 18:
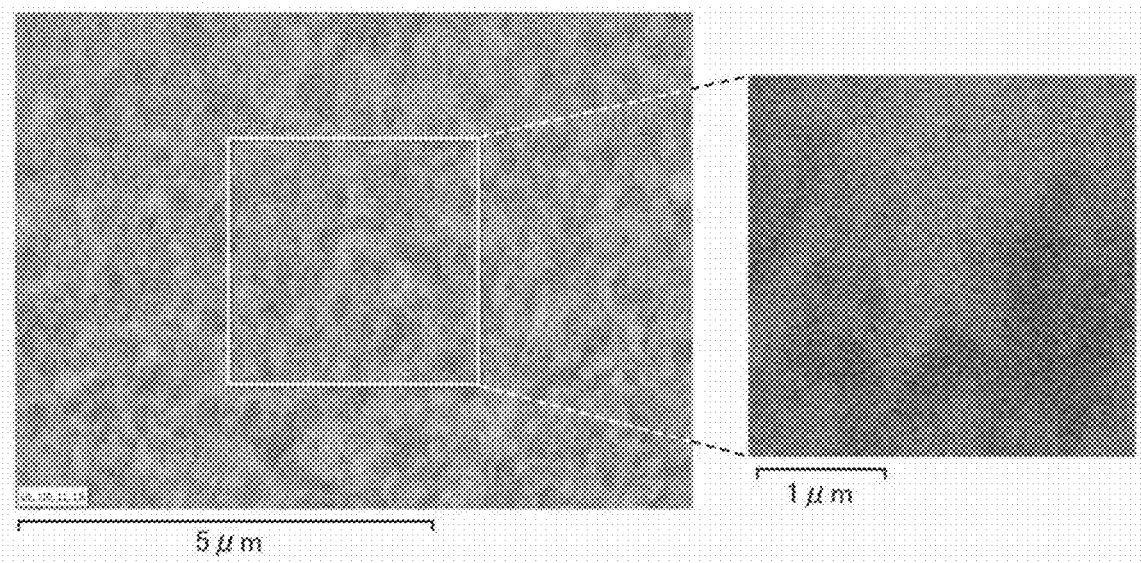
FIG. 18 shows an SEM image and an EDS mapping image of potassium.

FIG. 16 shows an SEM image and an EDS mapping image of potassium taken from a KNCNM layer surface after layer formation, before water washing. FIG. 17 shows an SEM image and an EDS mapping image of potassium taken from a KNCNM layer surface after layer formation, after water washing. FIG. 18 shows an SEM image and an EDS mapping image of potassium taken after the formation of the first KNNM layer, before water washing. In FIGS. 16 to 18, the EDS mapping image is a region of the SEM image surrounded by white solid lines.

As shown in FIG. 16, the top surface of the KNCNM layer had foreign materials containing potassium. The foreign materials are indicated by arrows in FIG. 16. As shown in FIG. 17, water washing removed the foreign materials that were present on the top surface of the KNCNM layer. As shown in FIG. 18, foreign materials were not observable on the top surface of the first KNNM layer. Removal of foreign materials from the top surface of the KNCNM layer by water washing was also confirmed by X-ray photoelectron spectroscopy (XPS).

In the present disclosure, some of the configurations may be omitted, or the embodiments or variations may be combined to such an extent that the features and the effects described in this specification are not lost.

The present disclosure is not limited to the embodiment described above, and various modifications are possible. For example, the present disclosure encompasses essentially the same configurations as the configurations described in the embodiment. Here, "essentially the same configurations" mean, for example, configurations that are the same as the configurations of the embodiment in terms of functions, methods, and results, or configurations that are the same as the configurations of the embodiment in terms of objects and effects. The present disclosure also encompasses configurations that have replaced non-essential parts of the configurations described in the embodiment. The present disclosure also encompasses configurations that can produce the same effects produced by the configurations described in the embodiment, or configurations that can achieve the same object achieved by the configurations described in the embodiment. The present disclosure also encompasses configurations that have combined known techniques with the configurations described in the embodiment.

What is claimed is:

1. A piezoelectric device comprising:
   a first electrode provided above a substrate;
   a piezoelectric layer provided above the first electrode; and
   a second electrode provided above the piezoelectric layer,
   the piezoelectric layer including a plurality of layers that includes a composite oxide of a Perovskite structure containing potassium, sodium, and niobium,
   the piezoelectric layer having a first region and a second region in a 3 μm×3 μm region of a plane perpendicular to a thickness direction of the piezoelectric layer,
   wherein the first region is a region in which a ratio of an atomic concentration (atm %) of potassium with respect to a sum of the atomic concentration (atm %) of potassium and an atomic concentration (atm %) of sodium is 0.30 to 0.45, and the second region is a region in which the ratio is 0.55 to 0.75.

2. The piezoelectric device according to claim 1, wherein the second region has an area ratio of 0.50 to 0.60 with respect to an area of the 3 μm×3 μm region.

3. The piezoelectric device according to claim 1, wherein the piezoelectric layer contains manganese.

4. A liquid ejection head comprising:
   the piezoelectric device of claim 1; and
   a nozzle plate having a nozzle hole for ejecting a liquid,
   the substrate having a channel-forming substrate that includes: a pressure generating chamber that undergoes a volumetric change effected by the piezoelectric device; and a supply channel that is in communication with the pressure generating chamber, and through which the liquid is supplied to the pressure generating chamber, and
   the nozzle hole being in communication with the pressure generating chamber.

5. A printer comprising:
   the liquid ejection head of claim 4;
   a transport mechanism by which a recording medium is moved relative to the liquid ejection head; and
   a controller that controls the liquid ejection head and the transport mechanism.

* * * * *